(12) United States Patent
Kim et al.

(10) Patent No.: US 9,861,008 B2
(45) Date of Patent: Jan. 2, 2018

(54) OUTDOOR UNIT OF AIR CONDITIONER

(71) Applicant: LG ELECTRONICS INC., Seoul (KR)

(72) Inventors: Kakjoong Kim, Seoul (KR); Jaehwa Jung, Seoul (KR); Chiwoo Song, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 92 days.

(21) Appl. No.: 14/661,038

(22) Filed: Mar. 18, 2015

(65) Prior Publication Data
US 2015/0271949 A1    Sep. 24, 2015

(30) Foreign Application Priority Data

Mar. 18, 2014 (KR) .................. 10-2014-0031813

(51) Int. Cl.
*H05K 7/20* (2006.01)
*F24F 1/24* (2011.01)

(52) U.S. Cl.
CPC ............. *H05K 7/2039* (2013.01); *F24F 1/24* (2013.01); *H05K 7/20272* (2013.01)

(58) Field of Classification Search
CPC .. F24F 1/24; F24F 1/22; H01L 23/473; H05K 1/0203; H05K 7/2039; H05K 7/20272; H05K 7/20936; H05K 7/2029
See application file for complete search history.

(56) References Cited

U.S. PATENT DOCUMENTS 8,693,200 B2 * 4/2014 Colgan ............... H01L 23/4093
                                                        361/679.52
2011/0126568 A1 * 6/2011 Okuda ..................... F24F 1/24
                                                        62/259.2
(Continued)

FOREIGN PATENT DOCUMENTS

CN           102016432       4/2011
EP            2 306 101       4/2011
(Continued)

OTHER PUBLICATIONS

Korean Office Action issued in Application No. 10-2014-0031813 dated May 18, 2015.
(Continued)

*Primary Examiner* — Robert J Hoffberg
*Assistant Examiner* — Hung Dang
(74) *Attorney, Agent, or Firm* — KED & Associates, LLP (57) ABSTRACT

An outdoor unit of an air conditioner is disclosed. The outdoor unit of the air conditioner includes an outdoor unit body, a printed circuit board having a heat generating element installed thereat, an electronic box mounted in the outdoor unit body, the electronic box having the printed circuit board installed therein, a heat dissipation module contacting the heat generating element, the heat dissipation module allowing refrigerant to flow therethrough, and a heat dissipation module support mounted in the outdoor unit body such that the heat dissipation module is fixed to the heat dissipation module support to support the heat dissipation module. Shaking of the heat dissipation module can be minimized when the electronic box is separated, thereby improving reliability of the heat dissipation module.

14 Claims, 9 Drawing Sheets

(56) References Cited

U.S. PATENT DOCUMENTS

| | | |
|---|---|---|
| 2012/0312046 A1 | 12/2012 | Kim et al. |
| 2015/0082822 A1 | 3/2015 | Teraki et al. |

FOREIGN PATENT DOCUMENTS

| | | |
|---|---|---|
| EP | 2 306 101 A1 | 4/2011 |
| EP | 2 857 764 A1 | 4/2015 |
| JP | 2013-194959 | 9/2013 |
| KR | 20-1998-0023267 | 7/1998 |
| KR | 20-1998-0027321 | 8/1998 |
| KR | 10-2009-0129198 | 12/2009 |
| KR | 10-1324935 B1 | 11/2013 |
| WO | WO 2010/087481 A1 | 8/2010 |
| WO | WO 2013/161323 A1 | 10/2013 |

OTHER PUBLICATIONS

European Search Report issued in Application No. 14194056.9 dated Jul. 28, 2015.
Korean Notice of Allowance dated Nov. 24, 2015.
Chinese Office Action dated Apr. 12, 2017 issued in Application No. 201510118274.5.

\* cited by examiner

OUTDOOR UNIT OF AIR CONDITIONER

This application claims the priority benefit of Korean Patent Application No. 2014-0031813, filed on Mar. 18, 2014 in the Korean Intellectual Property Office, the disclosure of which is incorporated herein by reference.

The present invention relates to an outdoor unit of an air conditioner and, more particularly, to an outdoor unit of an air conditioner configured such that a heat generating element installed at a printed circuit board is cooled by a refrigerant.

In general, an air conditioner is an apparatus that process suctioned air and supplies the processed air into a building or a room to maintain indoor air in a fresh state. The air conditioner may be classified as a window type air conditioner or a separate type (or split type) air conditioner.

The window type air conditioner, which has an integrated cooling and heat dissipation function, may be directly installed in an opening formed in the wall of a house or in a window of the house.

The separate type air conditioner includes an indoor unit including an indoor heat exchanger, an outdoor unit including a compressor and an outdoor heat exchanger, and a refrigerant pipe connected between the indoor unit and the outdoor unit.

The outdoor unit of the air conditioner may include an outdoor blower for blowing outdoor air to the outdoor heat exchanger. The outdoor unit of the air conditioner may include a printed circuit board for controlling various parts, such as the compressor or the outdoor blower. The printed circuit board may be installed in an electronic box.

The outdoor unit of the air conditioner may introduce outdoor air into the electronic box to remove heat from the electronic box such that various electric parts in the electronic box can normally operate without being overheated. In a case in which the interior of the electronic box is cooled in an air cooling fashion, however, it is not easy to effectively control the temperature of the electronic box according to the change in temperature of outdoor air.

An example of a conventional air conditioner is disclosed in Korean Patent No. KR 10-1324935 B1 (Nov. 1, 2013).

However, the conventional air conditioner has a problem in that an electronic box heat exchanger is provided in an electronic box and, therefore, the electronic box heat exchanger must be separated from an outdoor unit together with the electronic box for service, such as repair or maintenance, of electronic parts installed in the electronic box.

It is an object of the present invention to provide an outdoor unit of an air conditioner configured such that a heat generating element installed at a printed circuit board is cooled by a refrigerant.

This object is solved with the features of claim 1. The dependent claims relate to further aspects of the invention.

In accordance with an aspect of the present invention, the above and other objects can be accomplished by the provision of an outdoor unit of an air conditioner including an outdoor unit body, a printed circuit board having a heat generating element installed thereat, an electronic box mounted in the outdoor unit body, the electronic box having the printed circuit board installed therein, a heat dissipation module contacting the heat generating element, the heat dissipation module allowing refrigerant to flow therethrough, and a heat dissipation module support mounted in the outdoor unit body such that the heat dissipation module is fixed to the heat dissipation module support to support the heat dissipation module.

The heat dissipation module support may be installed such that at least a portion of the heat dissipation module support faces the electronic box.

The heat dissipation module support may be provided at a portion thereof facing the electronic box with a heat dissipation module fixing part, to which the heat dissipation module is fixed.

The heat dissipation module support may be installed in the outdoor unit body such that the heat dissipation module support is positioned at a rear of the electronic box.

The heat dissipation module may include a heat sink positioned between the heat generating element and the heat dissipation module support.

The heat sink may have a smaller size than the heat dissipation module support.

The electronic box may be provided with a heat sink through hole, through which the heat sink extends, the heat sink through hole having a smaller size than the heat dissipation module support. The heat dissipation module support may cover the heat sink through hole.

The heat dissipation module support may include a heat sink installation plate at which the heat sink is installed, the heat sink installation plate being spaced apart from the heat generating element. The heat generating element and the heat sink installation plate may be spaced apart from each other by a distance equal to a thickness of the heat dissipation module.

The heat dissipation module support may further include an outdoor unit body fastening part formed at the heat sink installation plate such that the outdoor unit body fastening part is fastened to the outdoor unit body.

The heat dissipation module may further include a refrigerant tube, through which the refrigerant passes. The refrigerant tube may include a heat sink contact part contacting the heat sink and a heat sink noncontact part not contacting the heat sink. The heat sink noncontact part may be positioned between the electronic box and the heat dissipation module support.

The heat sink may be provided with a refrigerant tube receiving part to receive the heat sink contact part. The refrigerant tube receiving part may face the heat dissipation module support.

The heat sink contact part of the refrigerant tube may be positioned between the heat sink and the heat dissipation module support.

The heat sink may be provided with a groove. The heat dissipation module support may include a protrusion, at least a portion of which is inserted into the groove.

The protrusion may include a plurality of protrusions spaced apart from each other such that the protrusions face each other. The groove may include a plurality of grooves formed at portions of the heat sink facing the protrusions.

The heat dissipation module support may include a plurality of elastic holders spaced apart from each other such that the elastic holders face each other. The heat sink may enter a space defined between the elastic holders such that the heat sink is elastically supported by the elastic holders.

The outdoor unit of the air conditioner may further include an outdoor blower installed in the outdoor unit body for moving outdoor air. At least a portion of the heat dissipation module support may be positioned between the electronic box and the outdoor blower.

In accordance with another aspect of the present invention, there is provided an outdoor unit of an air conditioner including an outdoor unit body, a printed circuit board having a heat generating element installed thereat, a heat dissipation module contacting the heat generating element or the printed circuit board, the heat dissipation module allowing refrigerant to flow therethrough, and a heat dissipation module support mounted in the outdoor unit body, the heat dissipation module support having a heat dissipation module fixing part, to which the heat dissipation module is fixed, to support the heat dissipation module, wherein the heat dissipation module includes a refrigerant tube, through which refrigerant passes and a heat sink contacting the refrigerant tube, the heat sink being fixed to the heat dissipation module fixing part such that the heat sink is positioned between the heat generating element and the heat dissipation module support.

The refrigerant tube may include a heat sink contact part contacting the heat sink and a heat sink noncontact part not contacting the heat sink, the heat sink may be provided with a refrigerant tube receiving part to receive the heat sink contact part, and the refrigerant tube receiving part may face the heat dissipation module support.

In accordance with a further aspect of the present invention, there is provided an outdoor unit of an air conditioner including an outdoor unit body, an outdoor blower installed at an upper part of the outdoor unit body, a printed circuit board having a heat generating element installed thereat, an electronic box mounted in the outdoor unit body, the electronic box having the printed circuit board installed therein, a heat dissipation module contacting the heat generating element or the printed circuit board, the heat dissipation module allowing refrigerant to flow therethrough, and a heat dissipation module support mounted in the outdoor unit body such that at least a portion of the heat dissipation module support is positioned between the electronic box and the outdoor blower, the heat dissipation module being fixed to the heat dissipation module support, wherein the heat dissipation module includes a refrigerant tube, through which refrigerant passes and a heat sink contacting the refrigerant tube, the heat sink being fixed to the heat dissipation module support such that the heat sink is positioned between the heat generating element and the heat dissipation module support.

The refrigerant tube may include a heat sink contact part contacting the heat sink, the heat sink contact part being positioned between the heat sink and the heat dissipation module support, and a heat sink noncontact part not contacting the heat sink, the heat sink noncontact part being positioned between the electronic box and the heat dissipation module support.

The heat sink may be provided with a refrigerant tube receiving part to receive the heat sink contact part. The refrigerant tube receiving part may face the heat dissipation module support.

The electronic box may be provided with a heat sink through hole, through which the heat sink extends, the heat sink through hole having a smaller size than the heat dissipation module support. The heat dissipation module support may cover the heat sink through hole.

The above and other objects, features and other advantages of the present invention will be more clearly understood from the following detailed description taken in conjunction with the accompanying drawings, in which.

Reference will now be made in detail to the preferred embodiments of the present invention, examples of which are illustrated in the accompanying drawings.

Figure 1:
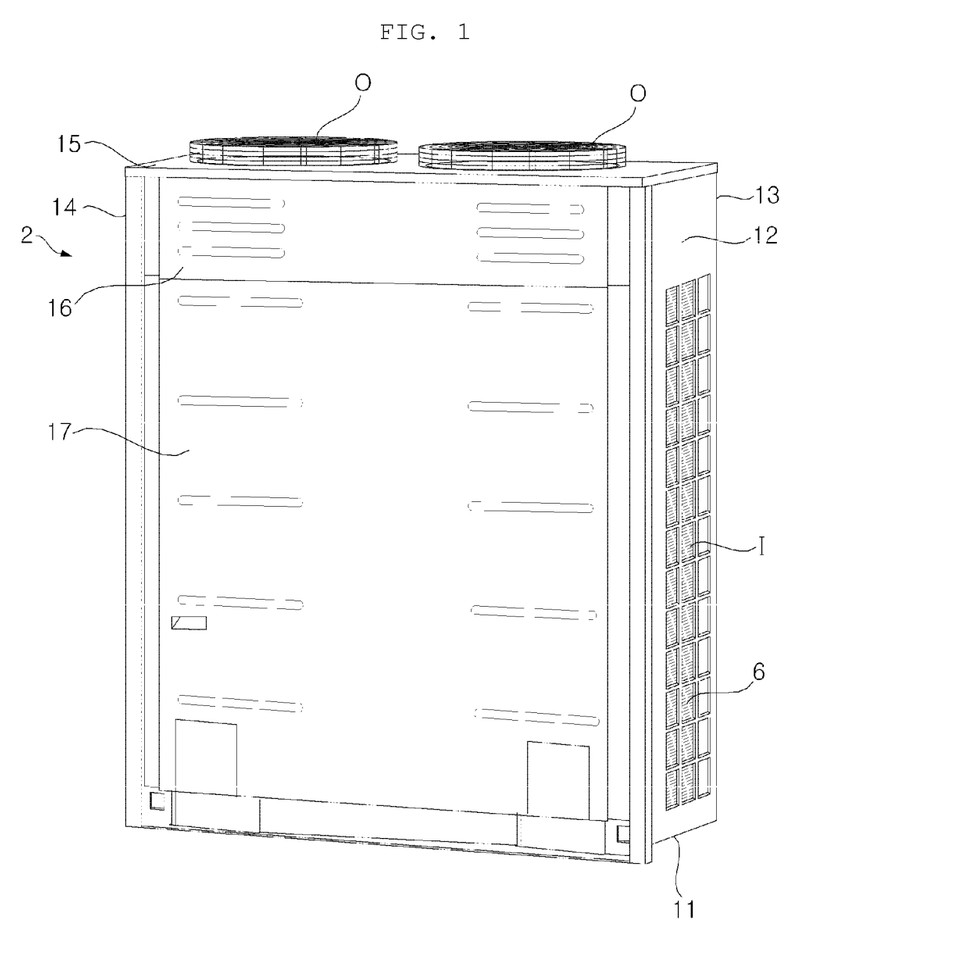
FIG. 1 is a perspective view showing an outdoor unit of an air conditioner according to an embodiment of the present invention.
Figure 2:
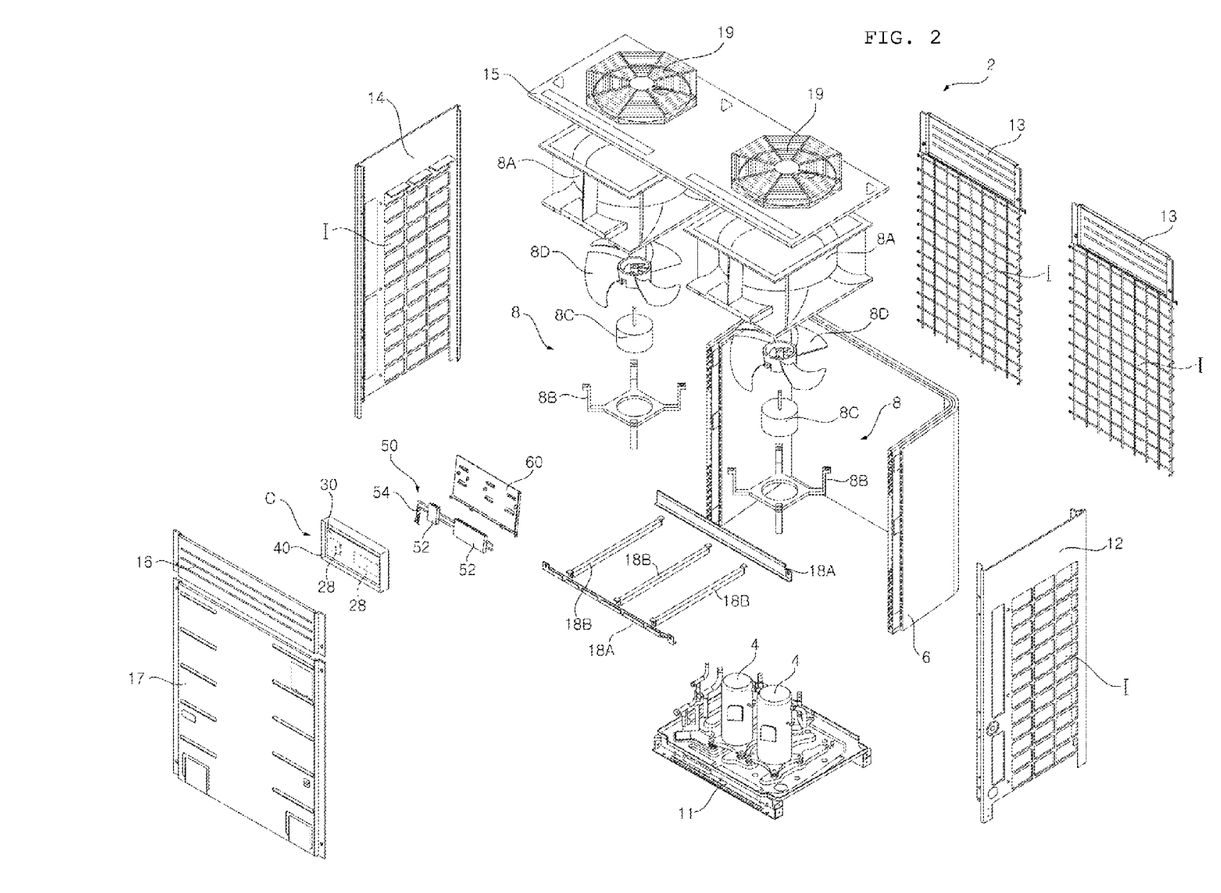
FIG. 2 is an exploded perspective view showing the outdoor unit of the air conditioner according to the embodiment of the present invention.
Figure 3:
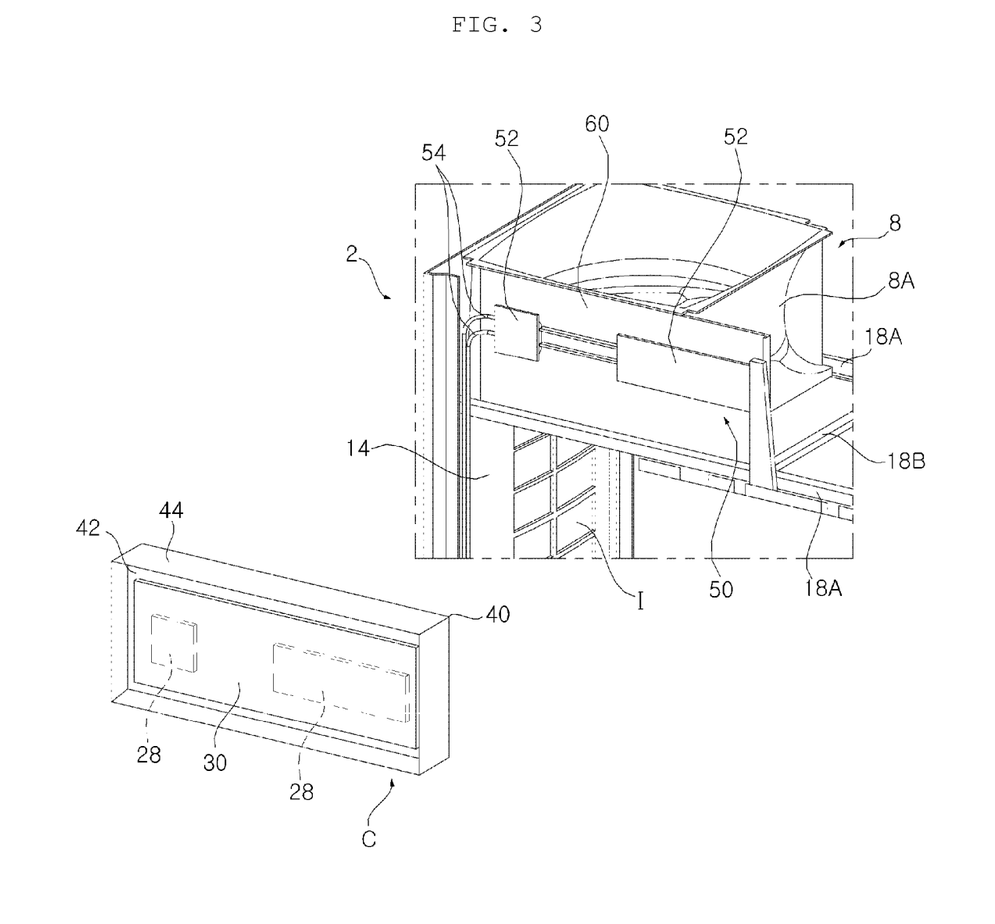
FIG. 3 is a partial exploded perspective view showing the outdoor unit of the air conditioner according to the embodiment of the present invention when an electronic box is separated from a heat dissipation module.

FIG. 1 is a perspective view showing an outdoor unit of an air conditioner according to an embodiment of the present invention, FIG. 2 is an exploded perspective view showing the outdoor unit of the air conditioner according to the embodiment of the present invention, and FIG. 3 is a partial exploded perspective view showing the outdoor unit of the air conditioner according to the embodiment of the present invention when an electronic box is separated from a heat dissipation module.

The outdoor unit of the air conditioner may include an outdoor unit body 2, a compressor 4, an outdoor heat exchanger 6, and an outdoor blower 8. The outdoor unit of the air conditioner may be connected to an indoor unit of the air conditioner via a liquid pipe and a gas pipe. Refrigerant may exchange heat with indoor air while passing through an indoor heat exchanger of the indoor unit of the air conditioner. The air conditioner may include an expansion device for expanding refrigerant in at least one selected from between the outdoor unit and the indoor unit. The expansion device may include an electronic expansion valve.

The outdoor unit body 2 may be provided with an air suction port I, through which outdoor air is suctioned into the outdoor unit body 2. The outdoor unit body 2 may be provided with an air discharge port O, through which air having exchanged heat with the outdoor heat exchanger 6 is discharged out of the outdoor unit body 2. The outdoor unit body 2 may form the external appearance of the outdoor unit.

The outdoor unit body 2 may include a base 11, cabinet bodies 12, 13, and 14 installed at the base 11, and a top cover 15 installed at the cabinet bodies 12, 13, and 14. The outdoor unit body 2 may further include outdoor unit covers and 17 for opening and closing the outdoor unit. The outdoor unit body 2 may further include a frame 18.

The air suction port I may be formed at each of the cabinet bodies 12, 13, and 14. The cabinet bodies 12, 13, and may be suction bodies, through which outdoor air is suctioned into the outdoor unit. The air suction ports I may be formed at a plurality of portions of the outdoor unit body 2. The cabinet bodies 12, 13, and 14 may be coupled to one another.

The cabinet bodies 12, 13, and 14 may include a left body 12, at which a left outdoor air suction port is formed, a rear body 13, at which a rear outdoor air suction port is formed, and a right body 14, at which a right outdoor air suction port is formed. The rear body 13 may be integrally formed with at least one selected from between the left body 12 and the right body 14. The rear body 13 may be fastened to at least one selected from between the left body 12 and the right body 14 using a fastening member, such as a screw. Each of the cabinet bodies 12, 13, and 14 may be provided at a portion thereof facing the outdoor heat exchanger 6 with a suction grill, at which the air suction port I is formed. A portion of each of the cabinet bodies 12, 13, and 14 facing the outdoor blower 8 may be flat.

The air discharge port O may be formed at the top cover 15. The top cover 15 may be a discharge body, through which outdoor air is discharged out of the outdoor unit. The top cover 15 may be horizontally installed at the tops of the cabinet bodies 12, 13, and 14. The top cover 15 may form the external appearance of the top of the outdoor unit. The outdoor blower 8 may be installed at the top cover 15.

The outdoor unit covers 16 and 17 may be fastened to at least one selected from among the base 11, the cabinet bodies 12, 13, and 14, and the frame 18. An engineer may separate the outdoor unit covers 16 and 17 from the outdoor unit and then couple the outdoor unit covers 16 and 17 to the outdoor unit for service, such as repair or maintenance, of the outdoor unit. The outdoor unit covers 16 and 17 may be fastened to at least one selected from among the base 11, the cabinet bodies 12, 13, and 14, and the frame 18 using fastening members, such as screws. The outdoor unit covers 16 and 17 may be configured as a single body or detachably coupled to each other. The outdoor unit covers 16 and 17, which may be configured as a single body or detachably coupled to each other, may be installed between the left body 12 and the right body 14 to shield the left body 12 and the right body 14 from each other. The outdoor unit covers 16 and 17 may form the external appearance of the outdoor unit. At least one of the outdoor unit covers 16 and 17 may be disposed to cover the front of an electronic box 40, which will hereinafter be described. At least one of the outdoor unit covers 16 and 17, e.g. the outdoor unit cover 16, may be a service cover for covering the front of the electronic box 40. An engineer may separate the service cover 16 from the outdoor unit and withdraw the electronic box 40 out of the outdoor unit for service of the electronic box 40. The electronic box 40 may be withdrawn out of the outdoor unit through a space defined between the left body 12 and the right body 14 in a state in which the service cover 16 is separated from the outdoor unit.

The frame 18 may support the outdoor unit body 2. At least one component of the outdoor unit may be mounted at the frame 18. The frame 18 may include a vertical frame which is vertically disposed at the outdoor unit. The frame 18 may include a horizontal frame which is horizontally disposed at the outdoor unit. A plurality of frames 18 may be provided. At least one of the frames 18 may be positioned between the lower of the blower 8 and the rears of the outdoor unit covers 16 and 17. The frame 18 may include a left and right frame 18A extending in a left and right direction. The left and right frame 18A may be positioned between the left body 12 and the right body 14. A plurality of left and right frames 18A may be positioned between the rear body 13 and the outdoor unit covers 16 and 17. The frame 18 may include a front and rear frame 18B extending in a front and rear direction. The front and rear frame 18B may be connected to the left and right frame 18A. The front and rear frame 18B may connect the left and right frames 18A to each other. A plurality of front and rear frames 18B may be positioned between the left and right frames 18A.

The compressor 4 may compress refrigerant. The air conditioner may be an air conditioner only for cooling. In this case, refrigerant compressed by the compressor 4 may sequentially pass through the outdoor heat exchanger 6, the expansion device (not shown), and the indoor heat exchanger (not shown) and is then introduced into the compressor 4. The air conditioner may be a heat pump type air conditioner. In this case, during a cooling operation, refrigerant compressed by the compressor 4 may sequentially pass through the outdoor heat exchanger 6, the expansion device (not shown), and the indoor heat exchanger (not shown) and is then introduced into the compressor 4. During a heating operation, on the other hand, refrigerant compressed by the compressor 4 may sequentially pass through the indoor heat exchanger (not shown), the expansion device (not shown), and the outdoor heat exchanger 6 and is then introduced into the compressor 4. The compressor 4 may be installed in the outdoor unit body 2. The compressor 4 may be installed at the upper of the base 11 in the outdoor unit body 2. The compressor 4 may be positioned in the outdoor unit at the lower part thereof. When the outdoor unit covers 16 and 17 are separated from the outdoor unit, the compressor 4 may be exposed outward. When the lower one of the outdoor unit covers 16 and 17, i.e. the outdoor unit cover 17, is separated from the outdoor unit, the compressor 4 may be exposed through the space defined between the left body 12 and the right body 14. A plurality of compressors 4 may be installed in the outdoor unit body 2. At least one of the compressors 4 may be a variable capacity compressor, the speed of which is varied by the change of an operational frequency, or an inverter compressor.

The outdoor heat exchanger 6 may perform heat exchange between outdoor air and refrigerant. The outdoor heat exchanger 6 may be installed in the outdoor unit body 2. The outdoor heat exchanger 6 may be installed at the upper of the base 11 in the outdoor unit body 2. The outdoor heat exchanger 6 may be bent at least once. The outdoor heat exchanger 6 may be positioned in a space defined by the cabinet bodies 12, 13, and 14. A left heat exchange part of the outdoor heat exchanger 6 facing the left body 12 and a right heat exchange part of the outdoor heat exchanger 6 facing the right body 14 may be connected to each other via a rear heat exchange part of the outdoor heat exchanger 6 facing the rear body 13. A plurality of outdoor heat exchangers 6 may be provided such that the outdoor heat exchangers 6 are spaced apart from each other. Specifically, the outdoor heat exchanger 6 may include a bent first heat exchanger constituted by the left heat exchange part facing the left body 12 and the rear heat exchange part facing the rear body 13 and a bent second heat exchanger constituted by the right heat exchange part facing the right body 14 and the rear heat exchange part facing the rear body 13.

The outdoor blower 8 may enable outdoor air to move. The outdoor blower 8 may be installed in the outdoor unit body 2. The outdoor blower 8 may move outdoor air to the outdoor heat exchanger 6 and then discharge the outdoor air out of the outdoor unit. The outdoor blower 8 may be installed in the outdoor unit body 2 at the upper part thereof. The outdoor blower 8 may be installed at the top cover 15 of the outdoor unit body 2. The outdoor blower 8 may suction air below the outdoor blower 8 and discharge the air upward. The outdoor blower 8 may include a shroud 8A for guiding discharge of outdoor air, a motor 8C, and a fan 8D connected to a rotary shaft of the motor 8C such that the fan 8D can be rotated along with the rotary shaft of the motor 8C. The motor 8C may be mounted at the frame 18. Alternatively, the motor 8C may be mounted through an additional motor mount 8B. The motor 8C may be installed at the motor mount 8B and the motor mount 8B may be fastened to at least one selected from among the shroud 8A, the top cover 15, and the frame 18. The shroud 8A may be fastened to at least one selected from between the top cover 15 and the frame 18. A plurality of outdoor blowers 8 may be installed in the outdoor unit body 2. A portion of the outdoor blower 8 may protrude upward from the top cover 15. The outdoor unit of the air conditioner may further include a discharge grill 19. The discharge grill 19 may be installed at the outdoor blower 8 or the top cover 15 to protect the outdoor blower 8.

The outdoor unit of the air conditioner may include a controller C for controlling the air conditioner. One controller C may be installed in the outdoor unit of the air conditioner. Alternatively, a plurality of controllers C may be installed in the outdoor unit of the air conditioner. The controller C may be installed in the outdoor unit of the air conditioner to control various electric parts, such as the compressor 4 or the outdoor blower 8. The controller C may communicate with the indoor unit of the air conditioner and control various electric parts, such as an indoor blower (not shown), installed in the indoor unit of the air conditioner. The controller C may include at least one electronic part for controlling various electric parts installed in the air conditioner. The at least one electronic part may include at least one printed circuit board having at least one electric element installed thereat. The at least one electric element may include at least one heat generating element 28 that generates heat during operation of the air conditioner.

The outdoor unit of the air conditioner may include a printed circuit board 30, at which the heat generating element 28 is installed, and an electronic box 40, in which the printed circuit board 30 is disposed, installed in the outdoor unit body 2. The outdoor unit of the air conditioner may include a heat dissipation module 50, through which refrigerant flows, contacting at least one selected from between the heat generating element 28 and the printed circuit board 30 and a heat dissipation module support 60 mounted in the outdoor unit body 2 such that the heat dissipation module 50 is fixed to the heat dissipation module support 60 to support the heat dissipation module 50.

The printed circuit board 30 may include an inverter drive printed circuit board for varying an operational frequency of an electric motor that drives the compressor 4. The printed circuit board 30 may be an inverter driver for controlling the inverter compressor. The heat generating element 28, such as an intelligent power module (IPM), which generates a large amount of heat, may be installed at the inverter drive printed circuit board.

The heat generating element 28, the printed circuit board 30, and the electronic box 40 may be the entirety or a portion of the controller C. The heat generating element 28 or the printed circuit board 30 may be separated from the electronic box 40 such that the heat generating element 28 or the printed circuit board 30 can be withdrawn out of the outdoor unit. Alternatively, the heat generating element 28 or the printed circuit board 30 may be separated from the outdoor unit body 2 together with the electronic box 40 such that the heat generating element 28 or the printed circuit board 30 can be withdrawn out of the outdoor unit together with the electronic box 40.

The electronic box 40 protects various electric parts, including the heat generating element 28 and the printed circuit board 30. The electronic box 40 may be open at one face thereof. The electronic box 40 may be formed in the shape of a box open at one face thereof. The printed circuit board 30 may be installed in a space defined inside the electronic box 40. The electronic box 40 may be open at a face thereof facing the outdoor unit covers 16 and 17. The electronic box 40 may include a back plate 42 and a frame 44 formed at the back plate 42. A space may be defined inside the frame 44 of the electronic box 40 and the printed circuit board 30 may be positioned inside the frame 44.

The electronic box 40 may be mounted to the outdoor unit body 2 using a fastening member, such as a screw. For service of the electronic box 40, the electronic box 40 may be separated from the outdoor unit body 2. The electronic box 40 may be fastened to at least one selected from among the left body 12, the right body 14, the service covers 16 and 17, the frame 18, and the outdoor blower 8 using a fastening member, such as a screw. The electronic box 40 may be mounted in the outdoor unit body 2 such that at least a portion of the electronic box 40 is positioned in front of the outdoor blower 8.

The heat dissipation module 50 may be connected to a refrigeration cycle circuit constituted by the compressor 4, the outdoor heat exchanger 6, the expansion device, and the indoor heat exchanger. The heat dissipation module 50 may be connected to any one selected from between a high temperature part and a low temperature part of the refrigeration cycle circuit, e.g. the low temperature part. Some of the refrigerant in the low temperature part of the refrigeration cycle circuit may pass through the heat dissipation module 50. While passing through the heat dissipation module 50, the refrigerant may absorb heat from the heat generating element 28. The heat dissipation module 50 may be a refrigerant type cooling module wherein at least a portion of the heat dissipation module is in contact with the heat generating element 28 to absorb heat from the heat generating element 28 through conduction and refrigerant cools the heat generating element 28. The heat dissipation module 50 may include a heat sink 52 contacting the heat generating element 28. The heat dissipation module 50 may include a refrigerant tube 54, through which refrigerant passes. One end of the refrigerant tube 54 may be connected to the low temperature part of the refrigeration cycle circuit. Alternatively, the other end of the refrigerant tube 54 may be connected to the low temperature part of the refrigeration cycle circuit. The refrigerant tube may be connected to a refrigerant pipe between the outer heat exchanger 6 and the expansion device or a refrigerant pipe between the expansion device and the inner heat exchanger.

The heat dissipation module support 60 may function as a heat dissipation module mount, to which the heat dissipation module 50 is mounted. The heat dissipation module support 60 may support the heat dissipation module 50 in a state in which the heat dissipation module support 60 is fixed to the outdoor unit body 2 when the heat dissipation module 50 is separated from the heat generating element 28.

If the heat dissipation module support 60 is not installed, the heat dissipation module 50 may easily shake when the heat dissipation module 50 is separated from the controller C. In addition, when the controller C is mounted in the outdoor unit body 2, it is necessary to perform an additional process of aligning the positions of the controller C and the heat dissipation module 50 to be fastened.

In a case in which the heat dissipation module 50 is supported in a state in which the heat dissipation module support 60 is mounted in the outdoor unit body 2, on the other hand, the heat dissipation module 50 may be securely supported by the heat dissipation module support 60 even when the heat dissipation module 50 is separated from the controller C. When the controller C is mounted in the outdoor unit body 2, the controller may easily contact the heat dissipation module 50 since the position of the heat dissipation module 50 is fixed by the heat dissipation module support 60.

The heat dissipation module support 60 may be mounted to the outdoor unit body 2 using a fastening member, such as a screw. The heat dissipation module support 60 may be installed so as to be positioned below the top cover 15. As shown in FIG. 3, the heat dissipation module support 60 may be mounted at the frame 18. The heat dissipation module support 60 may be located at the frame 18 and mounted to the frame 18 using a fastening member, such as a screw.

Figure 4:
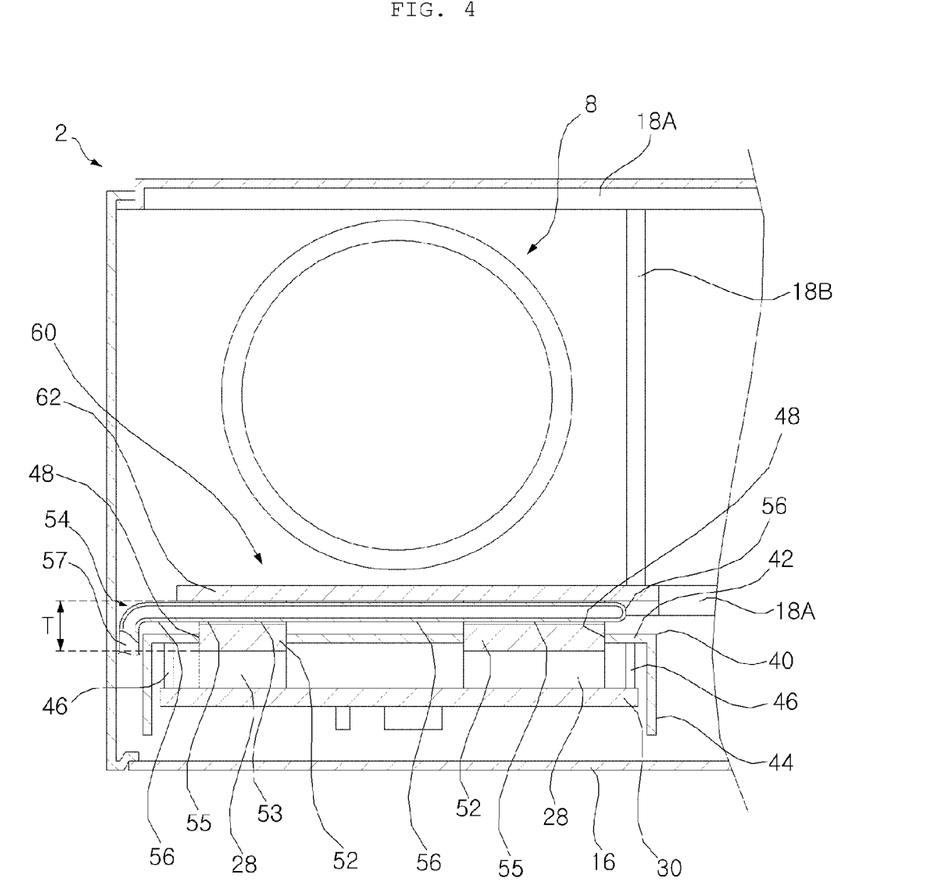
FIG. 4 is a cross sectional view showing the principal parts of the outdoor unit of the air conditioner according to the embodiment of the present invention.
Figure 5:
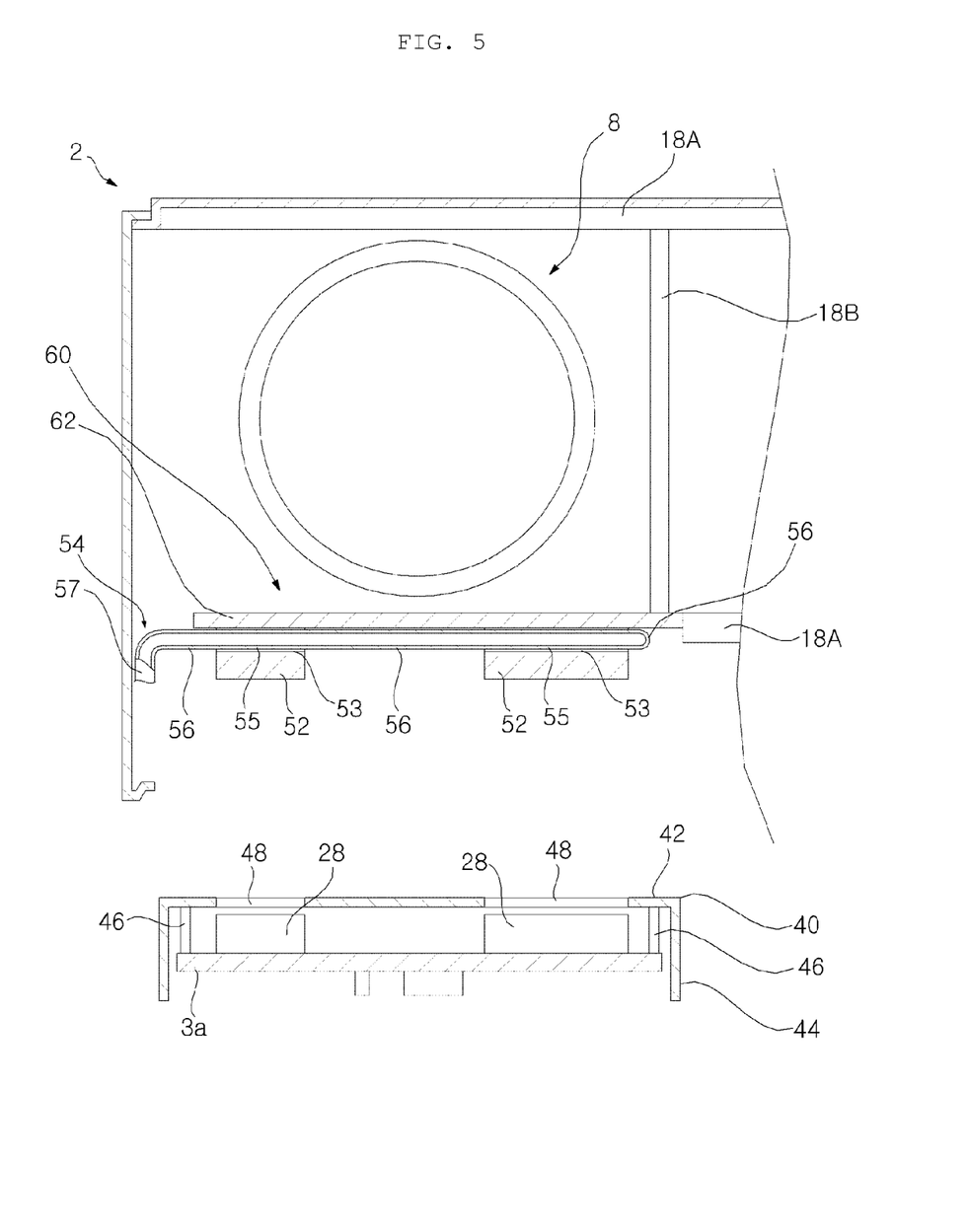
FIG. 5 is a cross sectional view showing the principal parts of the outdoor unit of the air conditioner according to the embodiment of the present invention when the electronic box is separated from FIG. 4.
Figure 6:
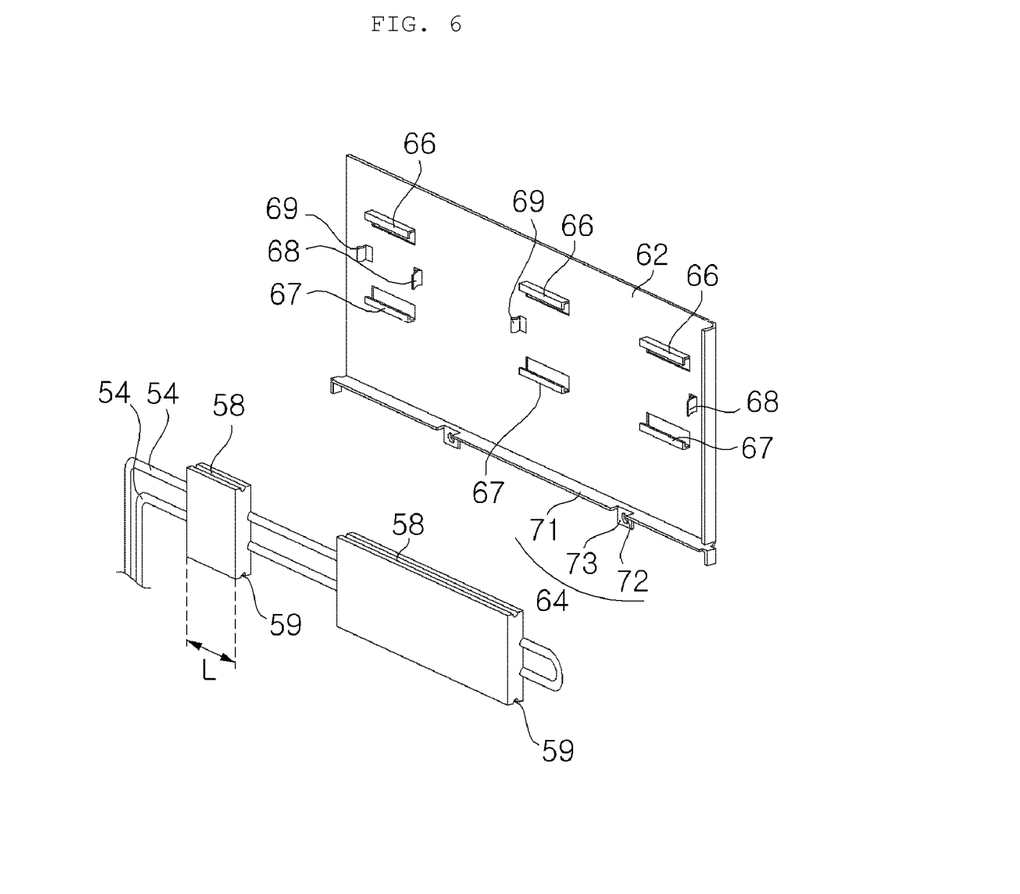
FIG. 6 is an exploded perspective view showing the heat dissipation module and a heat dissipation module support of the outdoor unit of the air conditioner according to the embodiment of the present invention.
Figure 7:
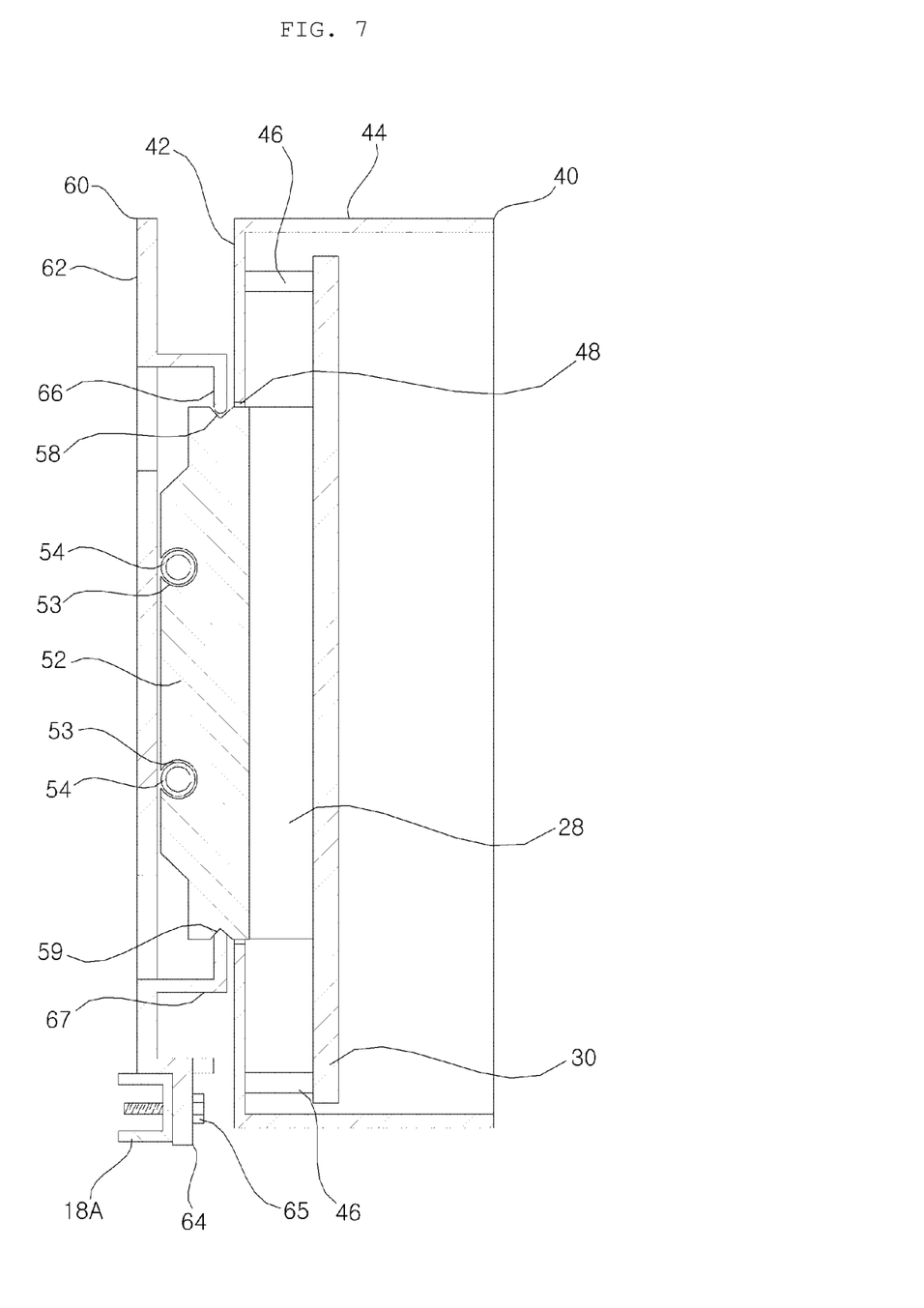
FIG. 7 is a longitudinal sectional view showing the principal parts of the outdoor unit of the air conditioner according to the embodiment of the present invention.
Figure 8:
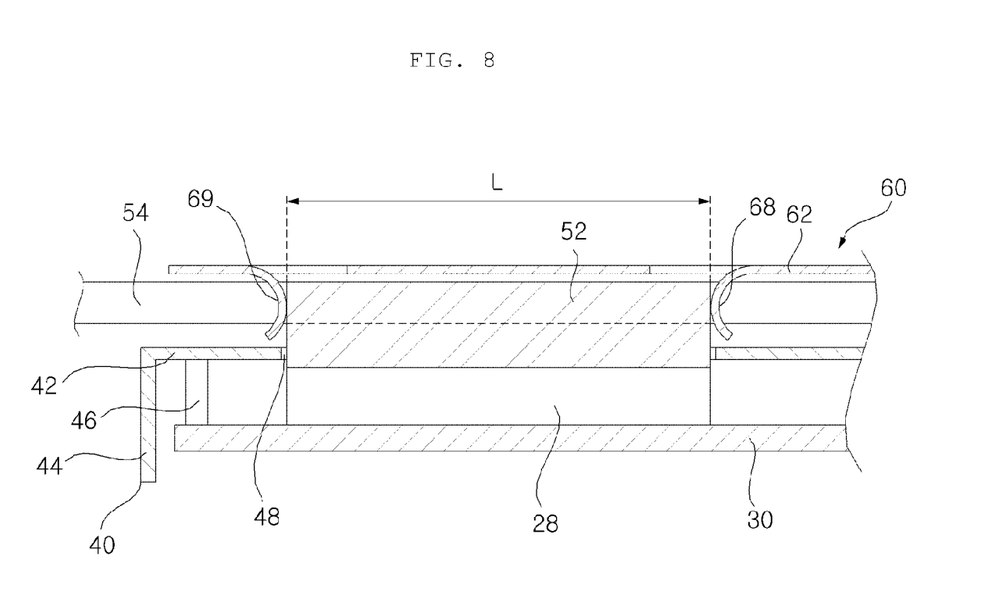
FIG. 8 is a cross sectional view showing the outdoor unit of the air conditioner according to the embodiment of the present invention when a heat sink is in contact with a heat generating element in a state in which the heat sink is supported by the heat dissipation module support.

FIG. 4 is a cross sectional view showing the principal parts of the outdoor unit of the air conditioner according to the embodiment of the present invention, FIG. 5 is a cross sectional view showing the principal parts of the outdoor unit of the air conditioner according to the embodiment of the present invention when the electronic box is separated from FIG. 4, FIG. 6 is an exploded perspective view showing the heat dissipation module and the heat dissipation module support of the outdoor unit of the air conditioner according to the embodiment of the present invention, FIG. 7 is a longitudinal sectional view showing the principal parts of the outdoor unit of the air conditioner according to the embodiment of the present invention, and FIG. 8 is a cross sectional view showing the outdoor unit of the air conditioner according to the embodiment of the present invention when the heat sink is in contact with the heat generating element in a state in which the heat sink is supported by the heat dissipation module support.

The heat generating element 28 may be installed at the printed circuit board 30 such that the heat generating element 28 does not contact the back plate 42 of the electronic box 40. The heat generating element 28 may be installed at the printed circuit board 30 such that the entirety or a portion of the heat generating element 28 protrudes backward.

The printed circuit board 30 may have a larger size than the heat generating element 28. The printed circuit board 30 may be installed at the back plate 42 of the electronic box 40. Between the printed circuit board 30 and the electronic box 40 may be disposed a spacer 46 for spacing the printed circuit board 30 from the back plate 42 of the electronic box 40.

The electronic box 40 may be provided with a heat sink through hole 48, through which the heat sink 52 of the heat dissipation module 50 extends. The heat sink through hole 48 may have a larger size than the heat sink 52. The heat sink through hole 48 may have a smaller size than the heat dissipation module support 60. The heat sink through hole 48 may be open at a portion thereof facing the heat dissipation module support 60 of the electronic box 40. The heat sink through hole 48 may be an opening, having a larger size than the heat sink 52, formed at the back plate 42 of the electronic box 40.

The heat dissipation module 50 may include a heat sink 52 and a refrigerant tube 54. The heat sink 52 may be positioned between the heat generating element 28 and the heat dissipation module support 60. The refrigerant tube 54 may contact the heat sink 52. The refrigerant tube 54 may include a heat sink contact part 55 which contacts the heat sink 52 and a heat sink noncontact part 56 which does not contact the heat sink 52.

The heat sink 52 may be fixed to the heat dissipation module support 60 such that the heat sink 52 is positioned between the heat generating element 28 and the heat dissipation module support 60. The heat sink 52 may have a smaller size than the heat dissipation module support 60. The heat sink 52 may be provided with a refrigerant tube receiving part 53 to receive the heat sink contact part 55. The refrigerant tube receiving part 53 may face the heat dissipation module support 60. The refrigerant tube receiving part 53 may extend in a longitudinal direction of the refrigerant tube 54. One portion of the heat sink 52 may face the heat generating element 28 and the other portion of the heat sink 52 may face the heat dissipation module support 60. The refrigerant tube receiving part 53 may be formed at a portion of the heat sink 52 facing the heat dissipation module support 60 such that the refrigerant tube receiving part 53 is depressed.

The heat sink 52 may contact the heat generating element 28 when the electronic box 40 is mounted. The heat sink 52 may be mechanically coupled to the heat generating element 28 in a state in which the heat sink 52 is in contact with the heat generating element 28. Alternatively, the heat sink 52 may be in contact with the heat generating element 28 in a state in which the heat sink 52 is not mechanically coupled to the heat generating element 28. The heat sink 52 may be coupled to the heat generating element 28 using a fastening member, such as a screw or a bolt and nut. The heat generating element 28 may be provided with a fastening hole, through which the fastening member is inserted. In addition, the heat sink 52 may be provided with fastening hole, through which the fastening member is inserted. The fastening member may be inserted through the fastening hole of the heat generating element 28 and then fastened into the fastening hole of the heat sink 52. Alternatively, the fastening member may be inserted through the fastening hole of the heat sink 52 and then fastened into the fastening hole of the heat generating element 28. In a case in which the heat sink 52 is fastened to the heat generating element 28 using the fastening member, the heat sink 52 may be first fixed to the heat dissipation module support 60 and then the electronic box 40 may be mounted in the outdoor unit body 2. When the electronic box 40 is mounted in the outdoor unit body 2, the heat generating element 28 may be easily fixed to the heat sink 52 without the provision of an additional device for aligning the fastening holes of the heat generating element 28 with the fastening holes of the heat sink 52 since the position of the heat sink 52 is fixed.

A portion of the refrigerant tube 54 may be inserted and received in the refrigerant tube receiving part 53 and the periphery of the portion of the refrigerant tube 54 received in the refrigerant tube receiving part 53 may be positioned between the electronic box 40 and the heat dissipation module support 60. The portion of the refrigerant tube 54 received in the refrigerant tube receiving part 53 may be the heat sink contact part 55. The periphery of the portion of the refrigerant tube 54 received in the refrigerant tube receiving part 53 may be the heat sink noncontact part 56.

The heat sink contact part 55 of the refrigerant tube may be positioned between the heat sink 52 and the heat dissipation module support 60. A front portion, an upper portion, and a lower portion of the heat sink contact part 55 of the refrigerant tube 54 in a circumferential direction thereof may be protected by the heat sink 52. In addition, a rear portion of the heat sink contact part 55 of the refrigerant tube 54 in the circumferential direction thereof may be protected by the heat dissipation module support 60.

The heat sink noncontact part 56 of the refrigerant tube 54 may be positioned between the electronic box 40 and the heat dissipation module support 60. The heat sink noncontact part 56 of the refrigerant tube 54 may be protected by the electronic box 40 and the heat dissipation module support 60.

The refrigerant tube 54 may include an extension 57 extending through a space defined between the electronic box 40 and the heat dissipation module support 60 and disposed at a position other than the space defined between the electronic box 40 and the heat dissipation module support 60. The extension 57 may be bent at least once. The extension 57 may be connected to low temperature part of the refrigeration cycle circuit.

The refrigerant tube 54 may include a heat sink contact part 55 positioned between the heat generating element and the heat dissipation module support 60, the heat sink noncontact part 56 positioned between the electronic box 40 and the heat dissipation module support 60, and the extension 57 disposed at a position other than the space defined between the electronic box 40 and the heat dissipation module support 60.

One refrigerant tube 54 may contact a plurality of heat sinks 52 of the heat dissipation module 50. The heat sinks 52 may contact different portions of the refrigerant tube 54. The heat sinks 52 may be spaced apart from each other in the longitudinal direction of the refrigerant tube 54. The heat sinks 52 may have different sizes. The heat sinks 52 may have the same height and different widths. The heat sinks 52 may include a first heat sink contacting one portion of the refrigerant tube 54 and a second heat sink contacting the other portion of the refrigerant tube 54. The second heat sink may have a larger size than the first heat sink.

The heat dissipation module support 60 may be installed such that at least a portion of the heat dissipation module support 60 faces the electronic box 40. The heat dissipation module support 60 may be installed in the outdoor unit body 2 such that the heat dissipation module support 60 is positioned at the rear of the electronic box 40. At least a portion of the heat dissipation module support 60 may be positioned between the electronic box 40 and the outdoor blower 8. The heat dissipation module support 60 may cover the heat sink through hole 48. If the heat dissipation module support 60 is not provided, a gap between the heat sink through hole 48 and the heat sink 52 may be exposed. As shown in FIG. 4, the heat dissipation module support 60 may cover the gap between the heat sink through hole 48 and the heat sink 52, thereby minimizing foreign matter, such as dust, from being introduced into the electronic box 40 through the gap between the heat sink through hole 48 and the heat sink 52.

The heat dissipation module support 60 may include a heat sink installation plate 62 at which the heat sink 52 is installed. The heat sink installation plate 62 may be spaced apart from the heat generating element 28. The heat sink installation plate 62 and the heat generating element 28 may be spaced apart from each other by a distance T equal to the thickness of the heat dissipation module 50. The heat dissipation module support 60 may further include an outdoor unit body fastening part 64 formed at the heat sink installation plate 62 such that the outdoor unit body fastening part 64 is fastened to the outdoor unit body 2.

The heat dissipation module support 60 may be provided at a portion thereof facing the electronic box 40 with heat dissipation module fixing parts 66, 67, 68, and 69. The heat sink 52 of the heat dissipation module 50 may be supported by the heat dissipation module fixing parts 66, 67, 68, and 69. The heat dissipation module fixing parts 66, 67, 68, and 69 may be formed at the heat sink installation plate 62. The heat dissipation module fixing parts 66, 67, 68, and 69 may be integrally formed at the heat sink installation plate 62. The heat dissipation module fixing parts 66, 67, 68, and 69 may protrude toward the electronic box 40. The heat sink 52 of the heat dissipation module 50 may be mounted at the heat dissipation module fixing parts 66, 67, 68, and 69 in a state in which the heat sink 52 is coupled to the refrigerant tube 54. The heat sink 52 may be inserted into the heat dissipation module fixing parts 66, 67, 68, and 69 in a state in which the heat sink 52 is positioned in front of the heat sink installation plate 62 such that the heat sink 52 is fixed to the heat dissipation module fixing parts 66, 67, 68, and 69 and supported by the heat dissipation module fixing parts 66, 67, 68, and 69.

The heat dissipation module fixing parts 66, 67, 68, and 69 may include protrusions 66 and 67, which will hereinafter be described. In addition, the heat dissipation module fixing parts 66, 67, 68, and 69 may include a plurality of elastic holders 68 and 69, which will hereinafter be described.

The heat sink 52 may be provided with grooves 58 and and the heat dissipation module support 60 may include protrusions 66 and 67, which are at least partially inserted into the grooves 58 and 59.

The grooves 58 and 59 may be formed at different portions of the heat sink 52. The grooves 58 and 59 may be formed at the portions of the heat sink 52 facing the protrusions 66 and 67. The grooves 58 and 59 may include a top groove 58 formed at the top of the heat sink 52 and a bottom groove 59 formed at the bottom of the heat sink 52. The grooves 58 and 59 may extend in a longitudinal direction of the heat sink 52. The grooves 58 and 59 may be depressed in the heat sink 52. The grooves 58 and 59 may be formed in a straight line.

The protrusions 66 and 67 may be spaced apart from each other such that the protrusions 66 and 67 face each other. The protrusions 66 and 67 may be integrally formed at the heat sink installation plate 62. The protrusions 66 and 67 may protrude forward from the heat sink installation plate 62. The protrusions 66 and 67 may be bent parts including a horizontal bent part horizontally protruding from the heat sink installation plate 62 and a vertical bent part bent from the horizontal bent part to the heat sink installation plate 62. The protrusions 66 and 67 may include a first protrusion 66 may include a first protrusion 66, a portion of which is inserted into one of the grooves 58 and 59, and a second protrusion 67, a portion of which is inserted into the other of the grooves 58 and 59. The first protrusion 66 may be an upper protrusion, the lower part of which is inserted into the top groove 58, and the second protrusion 67 may be a lower protrusion, the upper part of which is inserted into the bottom groove 59.

The heat dissipation module support 60 may include elastic holders 68 and 69 spaced apart from each other such that the elastic holders 68 and 69 face each other. The heat sink 52 may enter a space defined between the elastic holders 68 and 69 such that the heat sink 52 is elastically supported by the elastic holders 68 and 69.

The elastic holders 68 and 69 may include a pair of elastic holders, which may include a first elastic holder 68 contacting one side end of the heat sink 52 and a second elastic holder 69 contacting the other side end of the heat sink 52. The first elastic holder 68 may contact the left side end of the heat sink 52 and the second elastic holder 69 may contact the right side end of the heat sink 52. The shortest distance between the elastic holders before the heat sink 52 is mounted may be less than a longitudinal width L of the heat sink 52. When the heat sink 52 is mounted, the elastic holders may be elastically deformed such that the distance between the elastic holders is increased to support the heat sink 52.

The outdoor unit body fastening part 64 may be fastened to the outdoor unit body 2 using a fastening member 65, such as a screw.

The outdoor unit body fastening part 64 may include a location part 71 formed at the heat sink installation plate 62 such that the location part 71 is located at the outdoor unit body 2. The location part 71 may be located at the frame 18 of the outdoor unit body 2. The location part 71 may be horizontally bent from the lower part of the heat sink installation plate 62. The location part 71 may extend in a direction parallel to the horizontal frame 18A. The location part 71 may be located at the horizontal frame 18A. The outdoor unit body fastening part 64 may include a fastening piece 73 having a fastening hole 72, into which the fastening member 65 is fastened. The fastening piece 73 may be positioned so as to face the frame 18 of the outdoor unit body 2. The fastening member 65 may be fastened to the frame 18 through the fastening hole 72 of the fastening piece 73. The fastening piece 73 may be formed at the location unit 71. The fastening piece 73 may be formed at the location unit 71 such that the fastening piece 73 protrudes downward from the location unit 71. The fastening piece 73 may be positioned so as to face the horizontal frame 18A when the heat dissipation module support 60 is located at the horizontal frame 18A. The fastening member 65 may be fastened into a fastening hole 82 of the fastening piece 73 via a fastening hole (not shown) of the horizontal frame 18A in front of the fastening piece 73.

Hereinafter, an example in which the heat dissipation module 50 and the electronic box 40 are assembled will be described.

An engineer may mount the heat dissipation module support 60 in the outdoor unit body 2. The engineer may enter the heat sink 52 of the heat dissipation module 50 into a space defined between the elastic holders 68 and 69 while moving the heat sink 52 to the heat dissipation module support 60 in front of the heat dissipation module support 60. The heat sink 52 may be positioned between the elastic holders 68 and 69 while elastically deforming the elastic holders 68 and 69 such that the distance between the elastic holders 68 and 69 is increased to support the heat sink 52. The elastic holders 68 and 69 may support the heat sink 52 positioned therebetween.

During entry of the heat sink 52 as described above, the protrusions 66 and 67 of the heat dissipation module support 60 may be partially inserted into the grooves 58 and 59 of the heat sink 52. The heat sink 52 may be fitted between the protrusions 66 and 67

The heat sink 52 may be fixed to the heat dissipation module support 60 by simply pushing the heat sink 52 toward the heat dissipation module support 60. As the heat sink 52 is fixed to the heat dissipation module support 60, the heat sink 52 and the refrigerant tub 54 may be installed in a state in which shaking of the heat sink 52 and the refrigerant tub 54 is minimized.

In a state in which the heat dissipation module is mounted at the heat dissipation module support 60, the engineer may mount the electronic box 40 in the outdoor unit body 2. At this time, the heat generating element 28 may contact the heat sink 52 supported by the heat dissipation module support 60 such that the position of the heat sink 52 is fixed. When the electronic box 40 is mounted, the heat sink 52 may come into tight contact with the heat generating element 28 in a state in which the position of the heat sink 52 is fixed and absorb heat from the heat generating element 28 in a state in which contact between the heat sink 52 and the heat generating element 28 is maintained.

Hereinafter, an example in which the electronic box 40 is serviced will be described.

For service of the electronic box 40, the engineer may separate the electronic box 40 from the outdoor unit body 2. When the electronic box 40 is separated from the outdoor unit body 2, the heat generating element 28 may not contact the heat sink 52. The heat sink 52 may be left in the outdoor unit of the air conditioner together with the refrigerant tube 54.

The engineer may mount the serviced electronic box 40 in the outdoor unit body 2. Alternatively, the engineer may mount a new electronic box 40 in the outdoor unit body 2. When the engineer mounts the electronic box 40 in the outdoor unit body 2, shaking of the heat sink 52 is minimized since the position of the heat sink 52 is fixed. Consequently, the heat sink 52 may easily contact the heat generating element 28 of the electronic box 40. As a result, it is possible for the engineer to easily mount the electronic box 40 in the outdoor unit body 2 while the engineer does not perform a process of aligning the positions of the heat generating element 28 and the heat sink 52 or minimizes such an aligning process.

Figure 9:
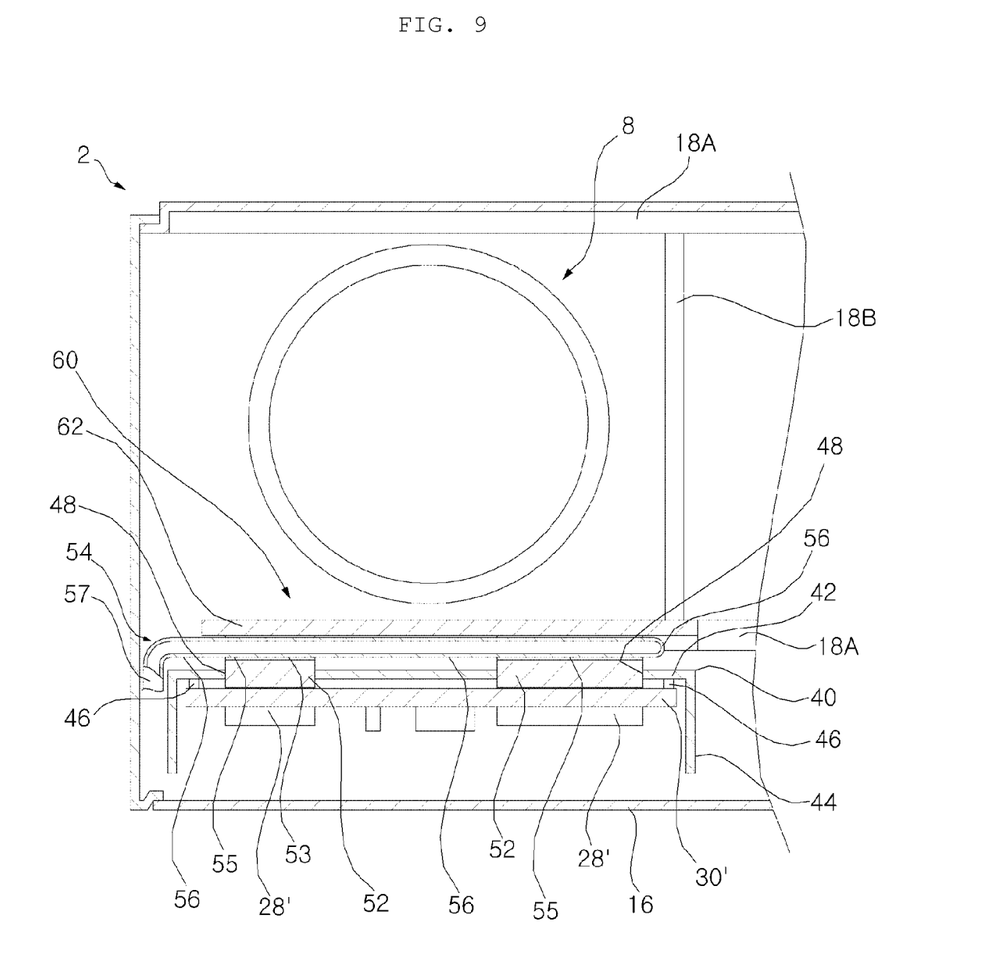
FIG. 9 is a cross sectional view showing the principal parts of an outdoor unit of an air conditioner according to another embodiment of the present invention.

FIG. 9 is a cross sectional view showing the principal parts of an outdoor unit of an air conditioner according to another embodiment of the present invention.

In this embodiment, the heat dissipation module 50 may be in contact with a printed circuit board 30' such that heat from a heat generating element 28' can be transmitted to the heat dissipation module 50 via the printed circuit board 30'. Other components of the outdoor unit of the air conditioner according to this embodiment excluding the printed circuit board 30' and the heat generating element 28' and operations thereof are identical or similar to those of the outdoor unit of the air conditioner according to the previous embodiment of the present invention. Consequently, the identical or similar components are denoted by the same reference numerals and a detailed description thereof will be omitted.

The heat generating element 28' may be installed at one portion of the printed circuit board 30' such that the heat generating element 28' faces the outdoor unit cover 16 indicating the front of the electronic box 40.

One portion of the printed circuit board 30' may face the outdoor unit cover 16 indicating the front of the electronic box 40 and the other portion of the printed circuit board 30' may contact the heat dissipation module 50.

The heat dissipation module 50 may be in surface contact with a portion of the other face of the printed circuit board 30'. One face of the heat sink 52 of the heat dissipation module 50 may be in surface contact with the other face of the printed circuit board 30'. For example, in a case in which the heat generating element 28' is installed at the front of the printed circuit board 30', the heat dissipation module 50 may be installed in contact with the rear of the printed circuit board 30'.

Although the outdoor unit of the air conditioner is configured such that the heat dissipation module 50 is in direct surface contact with the printed circuit board 30' as described above, the present invention is not limited thereto. For example, an additional heat transfer member (not shown) positioned between the heat dissipation module 50 and the printed circuit board 30' may be in surface contact with the heat dissipation module 50 and the printed circuit board 30'.

As is apparent from the above description, the present invention has the following effects.

The present invention has an effect in that the heat dissipation module can be easily and conveniently mounted.

In addition, the present invention has an effect in that shaking of the heat dissipation module can be minimized when the electronic box is separated or mounted, thereby improving reliability of the heat dissipation module.

In addition, the present invention has an effect in that the electronic box can be easily and conveniently assembled without necessity for adjusting assembly positions of the heat generating element and the heat dissipation module.

In addition, the present invention has an effect in that the heat sink can be protected by the heat dissipation module support and the heat generating element, thereby minimizing damage to the heat sink.

In addition, the present invention has an effect in that the heat dissipation module support can prevent foreign matter from being introduced into the electronic box.

In addition, the present invention has an effect in that the heat dissipation module support can minimize introduction of foreign matter into a space defined between the heat sink and the refrigerant tube.

In addition, the present invention has an effect in that the heat sink can be fixed in position due to elasticity of the elastic holders, thereby easily achieving installation of the heat sink.

In addition, the present invention has an effect in that the heat dissipation module support can be protected by the outdoor blower and the electronic box.

Although the preferred embodiments of the present invention have been disclosed for illustrative purposes, those skilled in the art will appreciate that various modifications, additions and substitutions are possible, without departing from the scope of the invention as disclosed in the accompanying claims.

The invention claimed is:

1. An outdoor unit of an air conditioner comprising:
an outdoor unit body;
a printed circuit board having a heat generating element installed thereat;
an electronic box mounted in the outdoor unit body, the electronic box having the printed circuit board installed therein;
a heat dissipation module that contacts the heat generating element, the heat dissipation module allowing refrigerant to flow therethrough; and
a heat dissipation module support mounted in the outdoor unit body such that the heat dissipation module is fixed to the heat dissipation module support to support the heat dissipation module, wherein the heat dissipation module comprises a heat sink positioned between the heat generating element and the heat dissipation module support,
wherein the electronic box is provided with a heat sink through hole, through which the heat sink extends, the heat sink through hole having a smaller size than the heat dissipation module support, and the heat dissipation module support covers the heat sink through hole.

2. The outdoor unit of the air conditioner according to claim 1, wherein the heat dissipation module support is installed such that at least a portion of the heat dissipation module support faces the electronic box.

3. The outdoor unit of the air conditioner according to claim 2, wherein the heat dissipation module support is provided at the portion thereof facing the electronic box with a heat dissipation module fixing part, to which the heat dissipation module is fixed.

4. The outdoor unit of the air conditioner according to claim 3, wherein the heat dissipation module support is installed in the outdoor unit body such that the heat dissipation module support is positioned at a rear of the electronic box.

5. The outdoor unit of the air conditioner according to claim 1, wherein the heat sink has a smaller size than the heat dissipation module support.

6. The outdoor unit of the air conditioner according to claim 1, wherein the heat dissipation module support comprises a heat sink installation plate at which the heat sink is installed, the heat sink installation plate being spaced apart from the heat generating element, and the heat generating element and the heat sink installation plate are spaced apart from each other by a distance equal to a thickness of the heat dissipation module.

7. The outdoor unit of the air conditioner according to claim 6, wherein the heat dissipation module support further comprises an outdoor unit body fastening part formed at the heat sink installation plate such that the outdoor unit body fastening part is fastened to the outdoor unit body.

8. The outdoor unit of the air conditioner according to claim 1, wherein the heat dissipation module further comprises a refrigerant tube, through which the refrigerant passes, wherein the refrigerant tube comprises:
a heat sink contact part that contacts the heat sink; and
a heat sink noncontact part, which does not contact the heat sink, and wherein the heat sink noncontact part is positioned between the electronic box and the heat dissipation module support.

9. The outdoor unit of the air conditioner according to claim 8, wherein the heat sink is provided with a refrigerant tube receiving part to receive the heat sink contact part, and the refrigerant tube receiving part faces the heat dissipation module support.

10. The outdoor unit of the air conditioner according to claim 8, wherein the heat sink contact part of the refrigerant tube is positioned between the heat sink and the heat dissipation module support.

11. The outdoor unit of the air conditioner according to claim 1, wherein the heat sink is provided with a groove, and the heat dissipation module support comprises a protrusion, at least a portion of which is inserted into the groove.

12. The outdoor unit of the air conditioner according to claim 11, wherein the protrusion comprises a plurality of protrusions spaced apart from each other such that the protrusions face each other, and the groove comprises a plurality of grooves formed at portions of the heat sink facing the protrusions.

13. The outdoor unit of the air conditioner according to claim 1, wherein the heat dissipation module support comprises a plurality of elastic holders spaced apart from each other such that the elastic holders face each other, and the heat sink enters a space defined between the elastic holders such that the heat sink is elastically supported by the elastic holders.

14. The outdoor unit of the air conditioner according to claim 1, further comprising:
an outdoor blower installed in the outdoor unit body to move outdoor air, wherein at least a portion of the heat dissipation module support is positioned between the electronic box and the outdoor blower.

* * * * *